US010120963B1

(12) United States Patent
Kumar et al.

(10) Patent No.: US 10,120,963 B1
(45) Date of Patent: Nov. 6, 2018

(54) FIGURATIVE MODELS CALIBRATED TO CORRECT ERRORS IN PROCESS MODELS

(71) Applicant: GlobalFoundries Inc., Grand Cayman (KY)

(72) Inventors: Pardeep Kumar, Bangalore (IN); Alan E. Rosenbluth, Yorktown Heights, NY (US); Ramana Murthy Pusuluri, Bangalore (IN); Ramya Viswanathan, Austin, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/587,602

(22) Filed: May 5, 2017

(51) Int. Cl.
G06F 17/50 (2006.01)
(52) U.S. Cl.
CPC ...... G06F 17/5009 (2013.01); G06F 17/5081 (2013.01); G06F 2217/10 (2013.01)
(58) Field of Classification Search
CPC ............ G06F 17/5009; G06F 17/5081; G06F 2217/10
USPC ............................................................ 703/1
See application file for complete search history.

(56) References Cited

U.S. PATENT DOCUMENTS 7,709,160 B2 *  5/2010  Yoshizawa ............... G03F 1/32
                                                             430/5
2007/0178392 A1 *  8/2007  Yoshizawa ............... G03F 1/32
                                                             430/5

* cited by examiner

*Primary Examiner* — Harry W Byrne
(74) *Attorney, Agent, or Firm* — Heslin Rothenberg Farley & Mesiti P.C.

(57) ABSTRACT

A method for correcting a lithographic pattern includes selecting, by a processor, first stage input factors for utilization with a first computer-implemented model. The processor measures pattern data from existing measured dimensions of a semiconductor to obtain values for the first stage input factors and the first model against the measured pattern data. The processor applies the calibrated first model to predict printed dimensions and the printed dimensions from applying the calibrated first model comprise residuals. The processor establishes, based on the residuals, second stage input factors for a second model and calibrates the second model against the measured pattern data to predict deviations of the printed dimensions from the printed dimensions from the first stage input factors by utilizing the second stage input factors. The method produces predicted printed dimensions of a lithographic pattern by using the second model to revise the printed dimensions of the first model.

12 Claims, 8 Drawing Sheets

FIGURATIVE MODELS CALIBRATED TO CORRECT ERRORS IN PROCESS MODELS

BACKGROUND OF THE INVENTION

Optical lithography is an important part of the process flow of Integrated Circuit (IC) manufacturing and involves the transfer of features from a mask onto a silicon wafer. During optical lithography, light is shone onto a mask pattern, which makes an imprint on the resist that lies over the silicon wafer, on the image plane. The proper functioning of the circuit on the mask depends on the accuracy of the transfer of the pattern from the mask to the silicon wafer.

Simulations of optical lithography are utilized to improve the eventual design. For example, optical lithography simulation is used to predict distortions so that they can be corrected during design. Unfortunately, optical lithography simulation, commonly referred to as "litho simulation," is slow because it is a computationally intensive and demanding task. Despite the demands of optical lithography simulation, completing this process can be a determining factor in time to market for the resultant chips. Thus, finding more efficient ways to complete accurate simulations is desirable because of the potential to improve both the performance and the capacity of these optical simulations.

To decrease the aforementioned heavy computational load required for an optical lithography simulation of a full-chip scale and increase the speed of the simulation, non-physical compact models are sometimes utilized, but this technique has obvious drawbacks. For one, the internal structure of these models is (to a substantial degree) not physically derived, and so does not inherently ensure accurate predictions. Additionally, compact models achieve accuracy through calibration against measurements and obtaining these measurements can be an intensive process that leaves room for errors. In fact, the aforementioned, lack of physical grounding in compact models can make the diagnosis of accuracy imperfections quite difficult. Although modeling and calibration procedures have evolved that provide adequate accuracy from manageable volumes of calibration data, when used by skilled practitioners, significant time and expense is often entailed, and greater accuracy would be preferred. Improvements to existing methodologies and processes, including continued iterations of standard modeling methodologies, have yielded only small incremental improvements in model accuracy. In fact, lengthy efforts to improve the accuracy of these approaches have yielded only modest additional improvements.

SUMMARY OF THE INVENTION

The shortcomings of the prior art are overcome and additional advantages are provided through the provision, in one aspect, of a method that includes, for instance: selecting, by a processor, first stage input factors for utilization with and assigning each step in a litho simulation process to a first computer-implemented model; measuring, by the processor, pattern data from existing measured dimensions of a semiconductor to obtain values for the first stage input factors; calibrating, by the processor, the first computer-implemented model against the measured pattern data; applying, by the processor, the calibrated first computer-implemented model to predict printed dimensions from the values of the first stage input factors, wherein the printed dimensions from applying the calibrated first computer-implemented model comprise residuals; selecting, by the processor, based on the residuals, second stage input factors for a second computer-implemented model, wherein the selecting comprises assigning each step in the litho simulation process to the second computer-implemented model; calibrating, by the processor, the second computer-implemented model against the measured pattern data to predict deviations of predicted printed dimensions, from the printed dimensions from the values of the first stage input factors, by utilizing values of the second stage input factors; and producing, by the processor, the predicted printed dimensions of a lithographic pattern by using the second computer-implemented model to revise the printed dimensions of the first computer-implemented model.

Computer systems and methods relating to one or more aspects of the technique are also described and may be claimed herein. Further, services relating to one or more aspects of the technique are also described and may be claimed herein.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
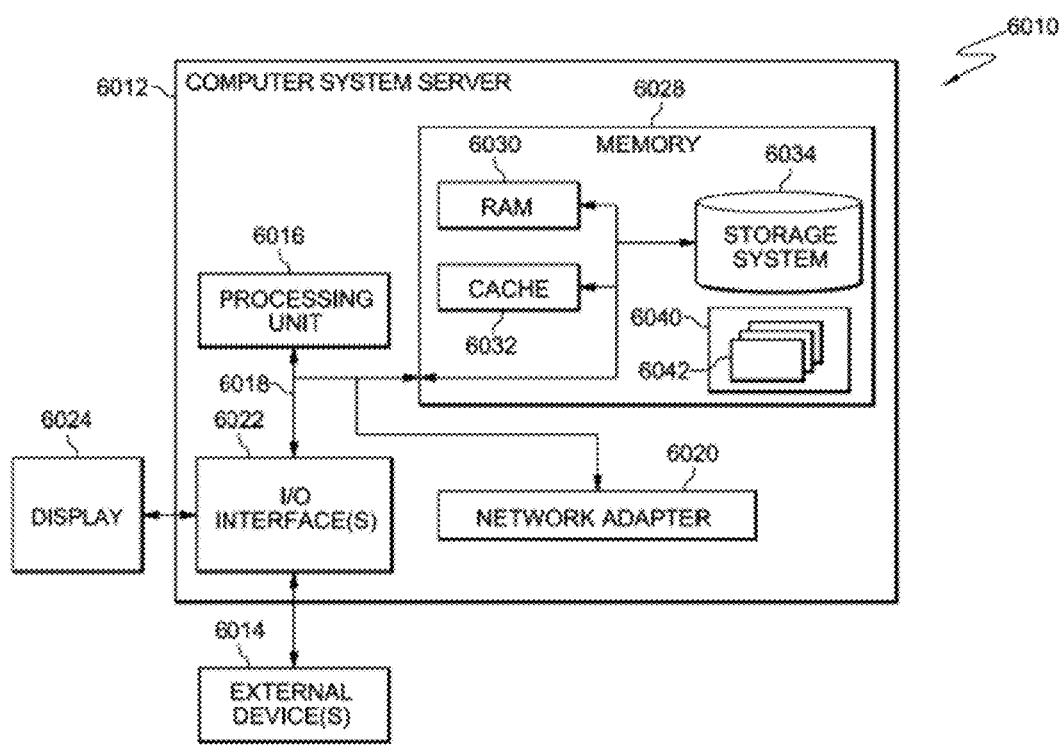
FIG. 1 depicts an embodiment of a computing node that may be utilized in an embodiment of the present invention.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components, when possible.

Current approaches to litho simulation include the use of compact models. As aforementioned, improving the accuracy of certain variables related to these models only produces marginal improvements in the overall simulation and therefore, the benefit of utilizing the litho simulation in the design process. Various parameters that can arguably be optimized in attempted at great accuracy using this traditional approach include weighting approach, boundary conditions, calibration algorithms, calibration data points, the number of data points, the model validation approach, and the number of iterations. However, the changes in these parameters provide only marginal improvements in model accuracy.

Rather than be limited by the marginal improvements of tuning the parameters in standard modeling approaches, embodiments of the present invention treat prediction errors introduced by compact process models (the aforementioned standard approach) as potentially correctable by figurative physical processes, and simulating the figurative processes by utilizing additional calibrated models. In an embodiment of the present invention, program code executing on at least one processor assigns each step in a litho simulation process to an established compact model. Thus an advantage of certain embodiments of the present invention is that these embodiments break through the asymptotic accuracy limit that hinder today's single stage models without compromising efficiency as the increase in accuracy is achieved by introducing a small extra step that gives significant improvement in the model accuracy.

Constructing a statistical model for predicting printed dimensions of a lithographic pattern is difficult because the physical basis of the model is complicated by many factors, including but not limited to the non-linear and imperfect response in the photoresist in the physical representation of the model. Patterning can be problematic because it can be affected by exposure and other environmental factors. Thus, models are a result of experience and the reasons why certain classes of models are successful is not generally known. In practice, one can take data and statistically calibrate and apply new shapes on a mask to adjust apertures in mask such that the resist process recreates the desired openings for patterns. However, it is expensive to take the measurements. Coefficients utilized in this process can be pushed too hard in an attempt to minimize errors, resulting in a fit being pushed beyond the best model. Thus, the success that can be achieved with a given model is limited.

Embodiments of the present invention present an advantage over known methods by conceiving of a gap between best known and calibration data. Rather than attempting to expand a known model by adding more terms, which is largely unsuccessful, in practice, because of evolutionary constraints, embodiments of the present invention combine models that work well in a novel manner. Aspects of embodiments of the present invention enable regularization of the fit, i.e., making sure that there is no overfitting.

Embodiments of the present invention include a computer systems, computer readable storage media storing instructions for execution by at least one processing circuit, and methods for predicting printed dimensions of a lithographic pattern. In an embodiment of the present invention, the method includes selecting, by a processor, first stage input factors for utilization with and assigning each step in a litho simulation process to a first computer-implemented model. The method also includes measuring, by the processor, pattern data from existing measured dimensions of a semiconductor to obtain values for the first stage input factors. The method includes calibrating, by the processor, the first computer-implemented model against the measured pattern data. The method includes applying, by the processor, the calibrated first computer-implemented model to predict printed dimensions from the values of the first stage input factors, wherein the printed dimensions from applying the calibrated first computer-implemented model comprise residuals. The method includes selecting, by the processor, based on the residuals, second stage input factors for a second computer-implemented model, wherein the selecting comprises assigning each step in the litho simulation process to the second computer-implemented model. The method includes calibrating, by the processor, the second computer-implemented model against the measured pattern data to predict deviations of predicted printed dimensions, from the printed dimensions from the values of the first stage input factors, by utilizing values of the second stage input factors. The method includes producing, by the processor, the predicted printed dimensions of a lithographic pattern by using the second computer-implemented model to revise the printed dimensions of the first computer-implemented model.

In an embodiment of the present invention, the first model and the second model are non-physical compact models for optical lithography simulation. The first model may be a compact resist model and the second model may be a ridge regression model. In an embodiment of the present invention where the second model is a ridge regression model, the second model does not utilize density of curvature terms.

In an embodiment of the present invention calibrating the first model includes applying, by the processor, statistical tests and constraints and stopping the applying before overfitting to the first model. In an embodiment of the present invention, calibrating the second model includes applying, by the processor, statistical tests and constraints to suppress overfitting.

In an embodiment of the present invention, establishing second stage input factors also includes deriving the second stage input factors additionally from mask patterns and image intensity patterns related to the semiconductor.

As understood by one of skill in the art, stopping before overfitting (which can also be understood as avoiding overfitting) a layer is standard procedure. However, embodiments of the present invention add a second stage to the procedures described herein that prevent overfitting and perform regularization. Embodiments of the present invention utilize two different procedures that create an enhanced stability control that exceeds the control offered by either stage individually.

As understood by one of skill in the art, aspects of the present invention can be implemented on one or more nodes of a computing system, which can optionally include one or more nodes of a cloud computing environment. FIG. 1 depicts an embodiment of a computing node that may include a server or other computing resource in a system into which aspects of the present invention are implemented. Implementing the improvement to modeling represented by embodiments of this invention utilizing a computer system represents a technological advance in the technical field of litho process simulation by increasing the accuracy of simulations without compromising the performance. Furthermore, litho simulation is necessarily rooted in computer technology in order to overcome a problem specifically arising in the realm of computer networks. Throughout the specification, the term program code is used to represent program code executed by one or more processors in a computer system.

Referring now to FIG. 1, a schematic of an example of a computing node is shown. Computing node 6010 is only one example of a suitable computing node and is not intended to suggest any limitation as to the scope of use or functionality of embodiments of the invention described herein. Regardless, computing node 6010 is capable of being implemented and/or performing any of the functionality set forth herein.

In computing node 6010 there is a computer system/server 6012, which is operational with numerous other general purpose or special purpose computing system environments or configurations. Examples of well-known computing systems, environments, and/or configurations that may be suitable for use with computer system/server 6012 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 6012 may be described in the general context of computer system executable instructions (referred to also as program code), such as program modules, being executed by a computer system. Generally, program modules may include routines, programs, objects, components, logic, data structures, and so on that perform particular tasks or implement particular abstract data types. Computer system/server 6012 may be practiced in distributed computing environments where tasks are performed by remote processing devices that are linked through a communications network. In a distributed environment, program modules may be located in both local and remote computer system storage media including memory storage devices.

As shown in FIG. 1, computer system/server 6012 in computing node 6010 is shown in the form of a general-purpose computing device. The components of computer system/server 6012 may include, but are not limited to, one or more processors or processing units 6016, a system memory 6028, and a bus 6018 that couples various system components including system memory 6028 to processor 6016.

Bus 6018 represents one or more of any of several types of bus structures, including a memory bus or memory controller, a peripheral bus, an accelerated graphics port, and a processor or local bus using any of a variety of bus architectures.

Computer system/server 6012 typically includes a variety of computer system readable media. Such media may be any available media that is accessible by computer system/server 6012, and it includes both volatile and non-volatile media, removable and non-removable media.

System memory 6028 can include computer system readable media in the form of volatile memory, such as random access memory (RAM) 6030 and/or cache memory 6032. Computer system/server 6012 may further include other removable/non-removable, volatile/non-volatile computer system storage media. By way of example only, storage system 6034 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 6018 by one or more data media interfaces. As will be further depicted and described below, memory 6028 may include at least one program product having a set (e.g., at least one) of program modules that are configured to carry out the functions of embodiments of the invention.

Program/utility 6040, having a set (at least one) of program modules 6042, may be stored in memory 6028 by way of example, and not limitation, as well as an operating system, one or more application programs, other program modules, and program data. Each of the operating system, one or more application programs, other program modules, and program data or some combination thereof, may include an implementation of a networking environment. Program modules 6042 generally carry out the functions and/or methodologies of embodiments of the invention as described herein.

Computer system/server 6012 may also communicate with one or more external devices 6014 such as a keyboard, a pointing device, a display 6024, etc.; one or more devices that enable a user to interact with computer system/server 6012; and/or any devices (e.g., network card, modem, etc.) that enable computer system/server 6012 to communicate with one or more other computing devices. Such communication can occur via Input/Output (I/O) interfaces 6022. Still yet, computer system/server 6012 can communicate with one or more networks such as a local area network (LAN), a general wide area network (WAN), and/or a public network (e.g., the Internet) via network adapter 6020. As depicted, network adapter 6020 communicates with the other components of computer system/server 6012 via bus 6018. It should be understood that although not shown, other hardware and/or software components could be used in conjunction with computer system/server 6012. Examples, include, but are not limited to: microcode, device drivers, redundant processing units, external disk drive arrays, RAID systems, tape drives, and data archival storage systems, etc.

Figure 2:
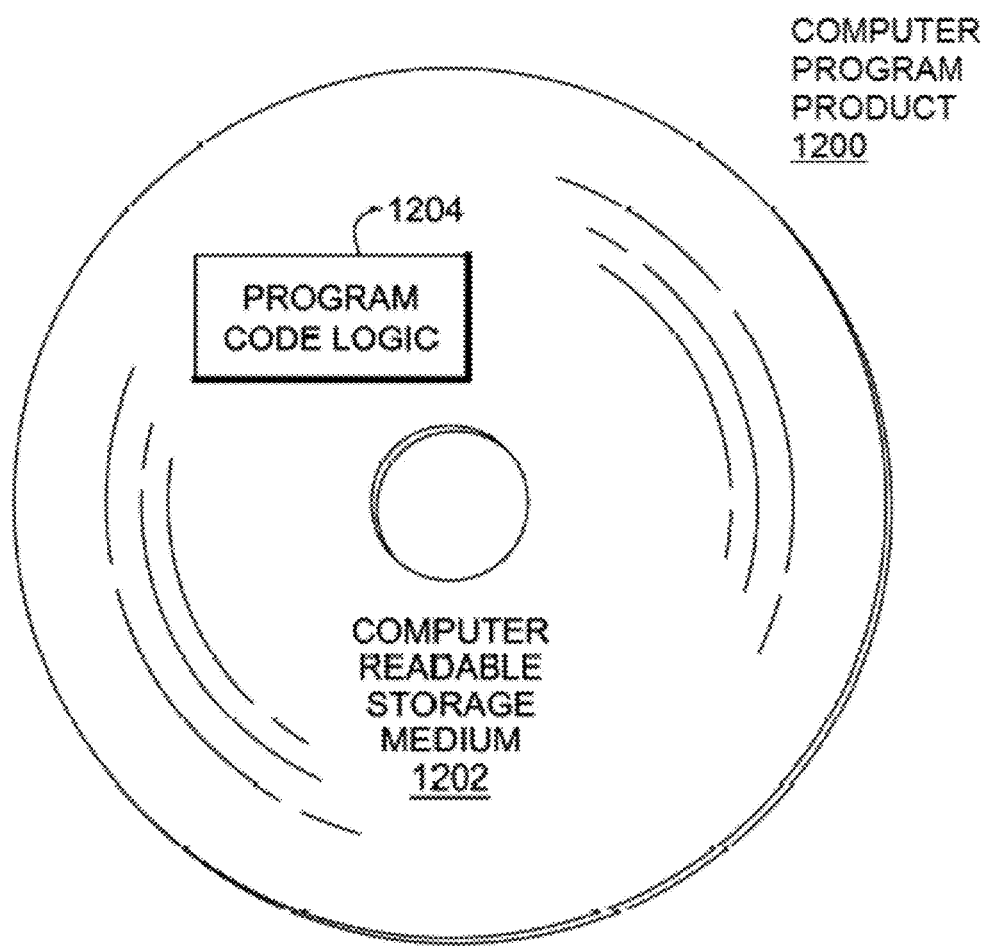
FIG. 2 depicts a computer program product that may be utilized in an embodiment of the present invention.

The computer program product may include a computer readable storage medium (or media) having computer readable program instructions thereon for causing a processor to carry out aspects of the present invention. Referring to FIG. 2, in one example, a computer program product 1200 includes, for instance, one or more non-transitory computer readable storage media 1202 to store computer readable program code means, logic and/or instructions 1204 thereon to provide and facilitate one or more embodiments. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

Although various embodiments are described above, these are only examples. For example, computing environments of other architectures can be used to incorporate and use one or more embodiments. Further, different instructions, instruction formats, instruction fields and/or instruction values may be used. Yet further, although examples of values for abort codes and condition codes are provided, other values may be used. Moreover, different, other, and/or additional restrictions/constraints may be provided/used. Yet further, other intervals may be provided and/or used in differing ways. Many variations are possible.

As aforementioned, embodiments of the present invention utilize multiple models in order to increase the efficiency of litho simulation while maintaining its accuracy. Staging multiple models is not equivalent to applying a single complex model, which would require complex computing and introduce inefficiencies into embodiments of the present invention. In embodiments of the present invention, physical steps are figuratively subdivided into nominally independent (i.e., quasi-independent) steps that proceed parallel to each other, such that the program code executing on one or more processor in an embodiment of the present invention may execute each figurative portion on its own horizontal model layer.

Vertical procedures involve applying a known model and sequentially applying a second model to the residuals. But embodiments of the present invention utilize a horizontal layering approach where rather than sequentially applying models to optical image to calibration data, aspects of the invention assume different weights being used for multiple models (e.g., 2-3 models) make each model focus on patterns and another vertically to combine into a final prediction. For example, in an embodiment of the present invention, program code can apply two models of the same class, but because the weights are different, calibration coefficients will differ. For example, in an embodiment of the present invention, by applying models with different characteristics both one dimensional and two dimensional patterns, a simulation may increase in accuracy. There is a natural division between one dimensional and two dimensional patterns: one dimensional patters include many important patterns while two dimensional patterns can be important, but not critical. When evaluating two different models, a first model can include a one dimensional weight that is relaxed and an adequate two dimensional weights. The second model may be strong for one dimensional patterns but weak for two dimensional patterns. By utilizing a local frequency domain, the program code decides how to consider each output. For example, quick geographic lists can be utilized to decide quantitative measures. In another example, one could generate direct coefficients, three different patch sizes spanning lens resolution: three (3) numbers, weights for each of the three numbers could be calibrated, one weight could be between 0 and 1.

Utilizing figurative models addresses prediction errors that can be introduced by applying compact models. Program code inserts physical models into litho simulation processes "as if" additional processes has been responsible for transferring imperfect conventional model predictions into true physical outcomes. In embodiments of the present invention the program code includes these quasi-independent (individually calibrated) interposed into a flow to address the deficiencies of the known models. The figurative models enable the program code to introduce strengthened regularization to the model. Separate stages enable the program code to explicitly address shortcoming of certain aspects of the invention in later aspects.

Embodiments of the present invention combine known compact models with figurative models in order to address known shortcomings of the compact models alone. This method is more efficient than utilizing a large complex model and more accurate than applying the compact models alone. To this end, embodiments of the present invention can be understood to comprise at least two aspects which may be characterized as stages: a first stage in which the program code executes a standard methodology by fitting an established compact model (e.g., a known-best model) to each physical process step in a fabrication flow, and a second stage (which may comprise multiple stages), where the program code applies the aforementioned figurative models, as if additional processes had been responsible for transferring the imperfect conventional model predictions into the true physical outcomes. By combining the use of compact models and compensating for the known shortcomings of this technique with additional figurative models, program code in embodiments of the present invention utilizes the stable and partially successful predictive behavior achieved by established compact models and locks these advantages into the overall flow of the model without introducing the shortcomings by locking these compact models into the flow of the process by retaining them as separately calibrated modules (or "layers").

As discussed above, embodiments of the present invention utilize a combination of compact and figurative models. Compact models of resist expose and/or develop processes typically predict an effective perturbation to the local dose threshold that defines the print contour. The separation between adjacent contour edges then defines a printed dimension. Program code generates model predictions by executing modelform functions which consist of basis terms that are adjusted and combined using empirically determined parameters. The basis terms ("input factors") in these models can be defined by a local optical exposure pattern (i.e., the image associated with the litho process).

Embodiments of the present invention include a method for predicting the dimensions of patterns printed by a lithographic process that is comprised primarily of two or more stages. The program code defines input factors for a pattern dimensional prediction. The program code defines these input factors from a mask layout and image employed by the lithographic process. The program code obtains measured dimensions of exposed calibration patterns for a first stage (compact model stage). In an embodiment of the present invention, these input factors are known. The program code calibrates the parameters of the (compact) first stage against the aforementioned measured pattern data to predict printed dimensions from the first stage input factors, applying statistical tests and constraints to avoid overfitting. The program code defines input factors for a second stage prediction that are derived from the mask patterns, image intensity patterns, and the computations of the first stage model. The program code calibrates parameters of a compact second stage computational model against the measured pattern data to predict deviations of the printed dimensions from the first stage predictions by means of the second stage input factors, by applying statistical tests and constraints to suppress overfitting. In this manner, in an embodiment of the present invention predicts the dimensions of lithographic patterns by using the second stage model to revise the predictions of the first stage model.

In an embodiment of the present invention, program code applies both the first stage model (compact models) and the second stage models (figurative models) without utilizing physical modeling. However, the risk of overfitting is minimized because embodiments of the present invention integrate certain methods with known accuracy into the computer modeling processes, including but not limited to, statistical tests (e.g. cross-validation with set-aside verification data, and artificial noise).

Two standard types of compact models are variable dose contour models and variable threshold models. For illustrative purposes, a specific group of variable dose contour models is referred to as "CM1" models and a specific group of variable threshold models is referred to as "VT5" models. These models are used throughout this specification as examples of possible variable dose models and variable threshold models that can be utilized with certain aspects of embodiments of the present invention. In a variable dose contour model, including but not limited to, a CM1 model, the program code derives basis terms from modified convolutions of kernels with the exposing optical image, which the program code calculates from the patterns on the litho mask. In a variable threshold model, including but not limited to, a VT5 model, the program code utilizes as basis terms quantitative traits (e.g., slope, peak intensity, minimum intensity) of the optical intensity trace along cutlines. Further, a variable contour dose (e.g., CM1) represents a response surface model with an adjustable threshold, while a variable threshold (e.g., VT5) model is a variable threshold model, with an adjustable response surface. Below, when a model is referred to as a CM1 model, please note that this one example is meant to encompass variable dose contour models, the CM1 is a common version of this model that is used as shorthand to represent models in this category. Similarly, when a model is referred to as a VT5 model, this title is meant to encompass variable threshold models, and the VT5 example is being used as a shorthand for the group of models that includes VT5 models.

In an embodiment of the present invention, the program code addresses the residuals of a first stage with a second stage. At the first and second stage, the program code selects basis terms in a manner that reduces noise sensitivity and utilizes various forms of constraints and regularization to inhibit overfitting. In an embodiment of the present invention, regularization and/or constraints include eigenvalue truncation and/or ridge regression. For example, by utilizing a CM1 model, the CM1 model adjusts response surface resist behavior. The VT5 model is seen as much closer to being ideal than optical intensity pattern (image). Thus, getting good fits utilizing both models involves less variability as the sequence utilized in a method of an embodiment of the present invention matches steps common to both types of models. Applying the CM1 first modifies driver input, optical image pattern. Overfitting, which is a large content in this type of lithographic process, is avoided and not artificially corrected.

In an embodiment of the present invention, as discussed above, the two-stage model uses well-established modelforms in each stage. In an embodiment of the present invention, stage 1 is CM1 and stage 2 is similar to VT5. These two modelforms provide complementary coverage. As is demonstrated in the examples that follow, the second stage applies VT5 in its standard role, i.e., as a way to match/predict CD data by robustly adjusting the print threshold for an image in a pattern-specific way, except that with staging the "image" in question is actually a CM1 modelform response surface that has already locked in a significant degree of correction for resist effects. In this manner, "resist" behavior in the second figurative patterning step is made more ideal. Thus, the figurative stage second pattern transfer is well-suited for modeling with VT5. During an optical proximity correction (OPC) operation, the final VT5-like model would drive shape adjustment in exactly the standard way, but the response surface from stage 1 replaces the aerial image as the primary input to the VT5-like model. Embodiments whose structure integrates into OPC in a more complex way are also possible. With all embodiments, a key innovative step during OPC operation is the staging of figurative models when simulating individual physical process steps. Thus, embodiments of the present invention generate lithographic masks with more accurately compensated patterns than existing methods.

Figure 3:
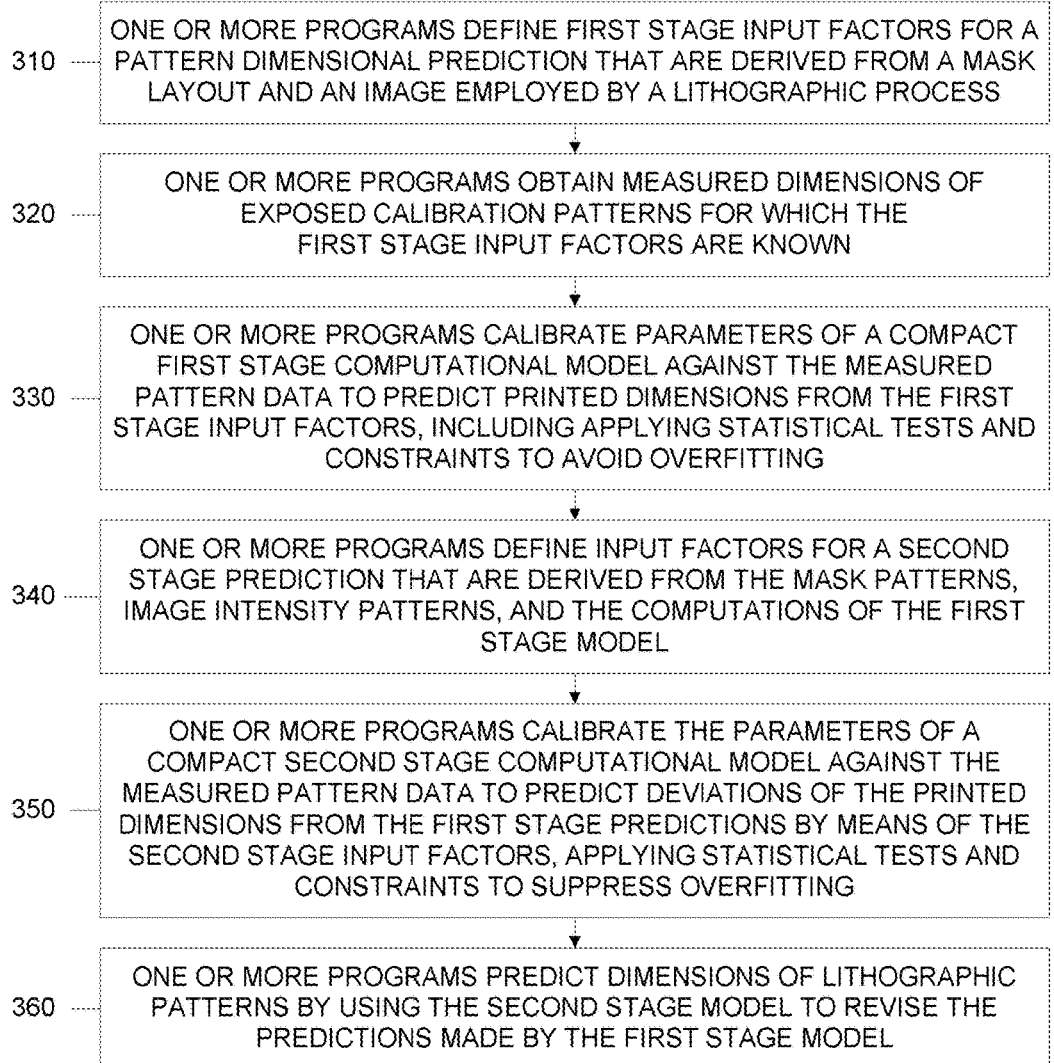
FIG. 3 is a workflow depicting aspects of an embodiment of the present invention.

FIG. 3 is a workflow 300 that depicts an embodiment of the present invention. Aspects of this embodiment comprise a method for rapidly predicting the dimensions of patterns printed by a lithographic process. In an embodiment of the present invention, one or more programs define first stage input factors for a pattern dimensional prediction that are derived from a mask layout and an image employed by a lithographic process (310). The one or more programs obtain measured dimensions of exposed calibration patterns for which the first stage input factors are known (320). The one or more programs calibrate parameters of a compact first stage computational model against the measured pattern data to predict printed dimensions from the first stage input factors, including applying statistical tests and constraints to avoid overfitting (330). The one or more programs define input factors for a second stage prediction that are derived from the mask patterns, image intensity patterns, and the computations of the first stage model (340). The one or more programs calibrate the parameters of a compact second stage computational model against the measured pattern data to predict deviations of the printed dimensions from the first stage predictions by means of the second stage input factors, applying statistical tests and constraints to suppress overfitting (350). The one or more programs predict dimensions of lithographic patterns by using the second stage model to revise the predictions made by the first stage model (360).

Embodiments of the present invention utilize weighted data in order to maximize coefficients to correct the look at variances in each pattern, by weighting the data by the variance. In embodiments of the present invention, the program code can adjust the weights in order to include patterns that are of particular importance in the lithographic process, based on engineering judgments.

As seen in FIG. 3, in embodiments of the present invention, the program code applies statistical tests at both the first and the second stage. The program code at the second stage has access to the computations at the first stage, embodiments of the present invention differ from horizontal modeling procedures due to this blending.

Figure 4:
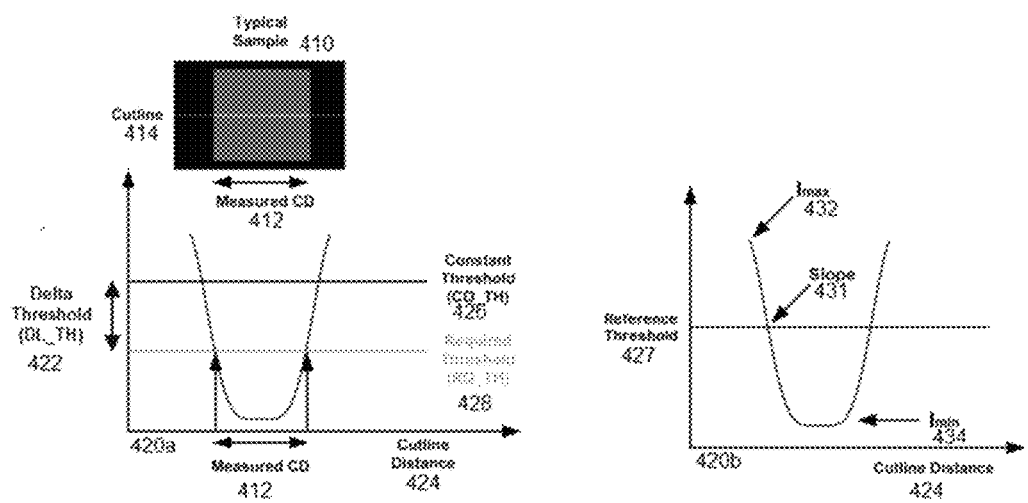
FIG. 4 illustrates aspects of model types that can be utilized in some embodiments of the present invention.
Figure 5:
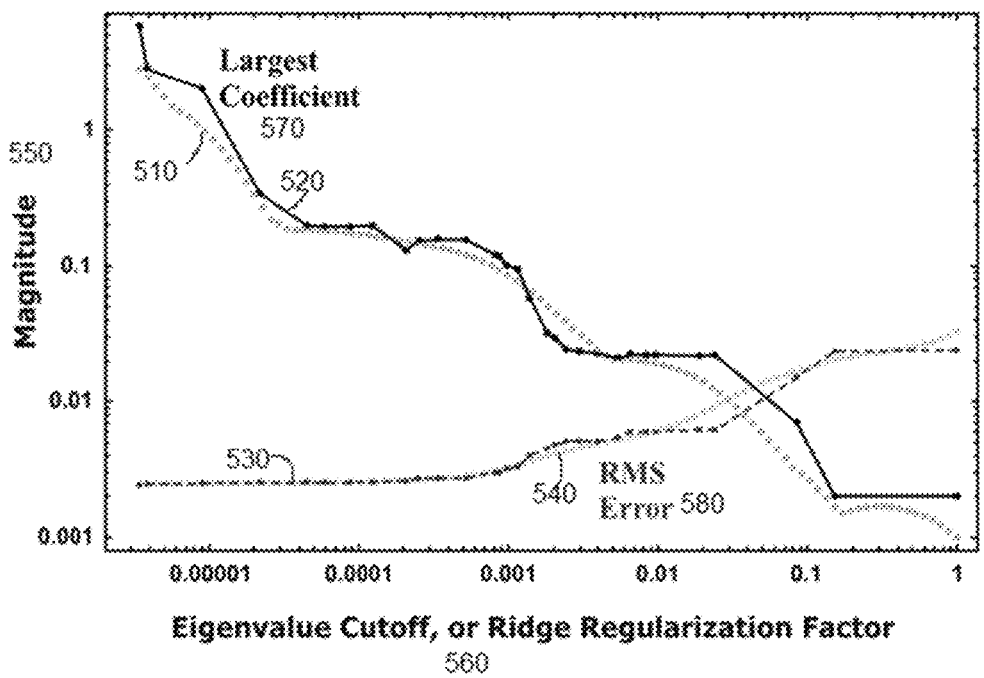
FIG. 5 illustrates aspects of model types that can be utilized in some embodiments of the present invention.

FIGS. 4 and 5 illustrate some specific model types that can be utilized in an embodiment of the present invention. For the purposes of this illustration, and not to limit future embodiments of the present invention, an MF22 model (a type of CM1 model) is utilized in the first stage and a VT5 model is utilized in the second stage. As seen in FIG. 4, when utilizing a CM1 (MF22) model, the thresholding modifies optical input terms. Thresholding image and gradient distribution are convolved (e.g., Gaussian with polynomials, trait list, and traits) and weighted to produce a map of adjusted surface threshold. Meanwhile, as seen in FIG. 5, a VT5 model adjusts threshold height using a one dimensional slice. In the example of FIG. 5, this involves the share of the overcut line is measured during calibration. The slope trait is known because the feature is symmetrical. The equations below, Equation 1 and Equation 2, are representative on an MF22 model application.

$$CO\_TH = c_1 I + c_{2+b2}{}^I \otimes G_{s2} + c_{3+b3}{}^I \otimes G_{s3} + c_{4-b4}{}^I \otimes G_{s4} + c_5 |\nabla I| \otimes G_{s5} + c_6 \sqrt{I} \otimes G_{s6} + c_7 \sqrt{I_{-b7}{}^2} \otimes G_{s7} + c_8 \Delta I \otimes G_{s8}$$ (Equation 1)

$$DL\_TH = \beta_0 + \beta_1 I_{max} + \beta_2 I_{min} + \beta_3 \text{Slope} + \beta_4 I_{min}*\text{Slope} + \beta_5 I_{max}*\text{Slope} + \beta_6 I_{max}*I_{min} + \beta_7 I_{max}*I_{min}*\text{Slope}$$ (Equation 2)

In this example, the Required Threshold (RQ_TH)= CO_TH−DL_TH, where CO_TH is the constant threshold and DL_TH is the delta threshold. As illustrated in FIG. 4, a typical sample 410 includes a cutline 414 and a measured CD 412. Two different views are offered of the Image Cutline Trace 420a-b of the first stage model. In the first view 420a, the delta threshold 422 is compared to the cutline distance 424, with the measured CD 412 highlighted in the graphed parabola. Both the constant threshold 426 and the required threshold 428 are displayed. In the second image view 420b, the reference threshold 427 is shown over the cutline distance 424. The slope 431, including its maximum 432 and minimum 434 values are indicated.

A VT5 model that is utilized in a second stage of the method of an embodiment of the present invention can differ from more standard VT5 models. For example, existing single-stage VT5 models use eigenvalue truncation (EVT) to regularize their least squares calibration fit. In embodiments of the present invention one or more programs utilize a VT5 that is regularized with ridge regression, which replaces EVT's abrupt truncation of the weak end of the eigenvalue spectrum with a smooth attenuation. Equations 3 and 4 below illustrate aspects on a VT5 model and compare an existing VT5 model to a second stage model that can be utilized in an embodiment of the present invention, a ridge regression to avoid overfitting. In Equations 3 and 4, Y represents empirical thresholds, x represents basis terms, $\beta$ represents fitted coefficients, and k is the regularization parameter.

$$\hat{\beta}^{OLS} = \operatorname*{argmin}_{\beta} \left\{ \sum_{i=1}^{n} \left( Y_i - \beta_0 - \sum_{j=1}^{p} x_{i,j}\beta_i \right)^2 \right\}$$ (Equation 3)

$$\hat{\beta}^{ridge} = \operatorname*{argmin}_{\beta} \left\{ \sum_{i=1}^{n} \left( Y_i - \beta_0 - \sum_{j=1}^{p} x_{i,j}\beta_j \right)^2 + k\sum_{j=1}^{p} \beta_j^2 \right\}$$ (Equation 4)

The following trends hold regarding k, the regularization parameter:

As k→0, $\hat{\beta}^{Ridge} \to \hat{\beta}^{OLS}$
As k→∞, $\hat{\beta}^{Ridge} \to 0$ FIG. 5 illustrates the second stage model in an embodiment of the present invention by illustrating a comparison between behavior of an eigenvalue truncation, in an existing VT5 model, and behavior of ridge regression, for a VT5 model, in this instance, used at 65 nm. As seen in FIG. 5, with ridge regression the eigenvalues (and associated vectors) are smoothly damped, instead of being abruptly truncated. Thus, utilizing ridge regression represents an improvement over existing VT5 models because it is more predictable. FIG. 5 is a graph with magnitude 550 on the y-axis and eigenvalue cutoff or ridge regression factor 560 on the x-axis. Taking into account the largest coefficient 570, FIG. 5 compares the ridge regression 510 to the eigenvalue truncation 520. The smoothness of the ridge regression 510 as compared to the eigenvalue truncation 520 is apparent in this illustration. FIG. 5 also provides the root mean square (RMS) error 580, from the perspective of the eigenvalue truncation 530 and the ridge regression 540. As seen in FIG. 5, a goal of embodiments of the present invention is to produce a result that is more smoothly adjustable. Thus, objective are set as regression, minimizing the sum square level, taking the derivatives of the variables. In a smoother result, there are not abrupt jumps. As an example, in FIG. 5, the baseline stage 1 threshold is approximately 0.2.

Figure 6:
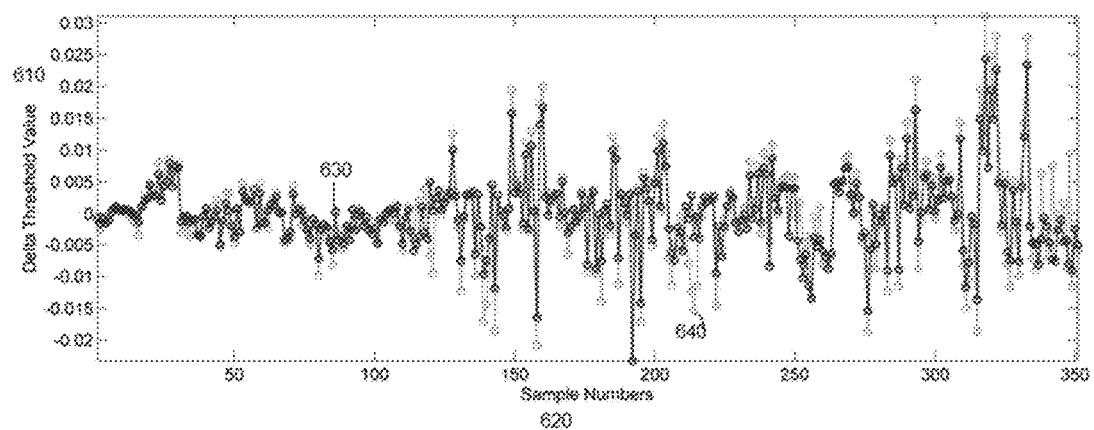
FIG. 6 is demonstrates that a threshold of values narrows when utilizing embodiments of the present invention.

FIG. 6 is an illustration how when one or more programs executing on a computing resource applies the second stage model, the threshold of values narrows, becoming smoother, which is the goal of embodiments of the present invention. In FIG. 6, just as an example, the models are fit to the 50% of a dataset that is used for calibration with a ridge parameter of k=0.1. In this simulation, the First Stage Unweighted Error RMS (nm) is 2.51 and the Second Stage Unweighted Error RMS (nm) is 1.15, exhibiting an improvement of 54.1%. In FIG. 6, this improvement is illustrated by comparing the data threshold values 610 sample numbers 620. As seen from the resulting graphed values, the delta threshold from the measured CD after CM1 (the first model stage) 640, is less smooth than the delta threshold after application on the VT5 (the second stage model) 630, in accordance with an embodiment of the present invention.

Figure 7:
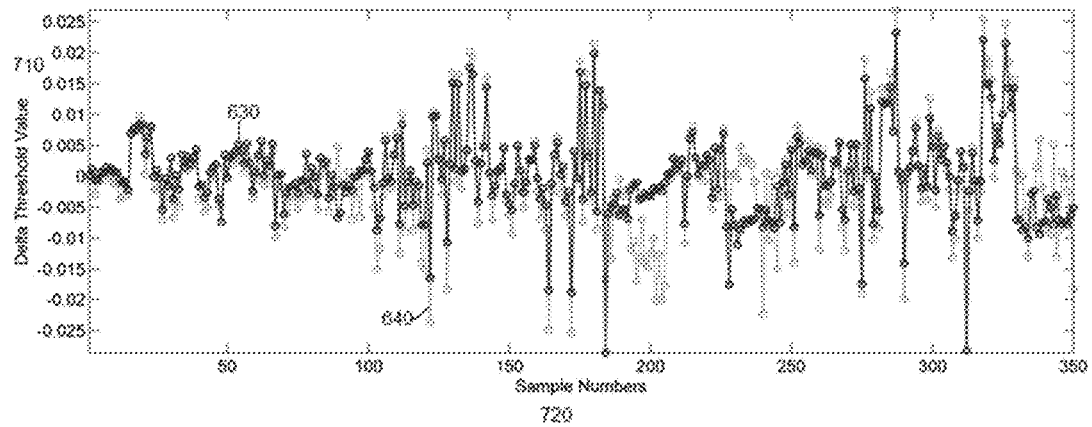
FIG. 7 illustrates the variance of deltas when utilizing various aspects of embodiments of the present invention.

FIG. 7 provides a further illustration of the variance of deltas when results of aspects of an embodiment of the present invention are compared for the threshold measured CD after the first stage 740, as compared with the threshold values after the second stage 730. In contrast to the example in FIG. 6, FIG. 6 demonstrates Set-aside Verification Results ("Opposite Data Set"), with a Ridge parameter of k=0.1, a First Stage Unweighted Error RMS (nm) of 2.89, and a Second Stage Unweighted Error RMS (nm) of 1.64. The improvement between the first stage and the second stage in 43.2%. Again, the delta threshold from following the first stage with the second (e.g., VT5), shows less variance and produces a smoother result. As seen in FIG. 7, the validation error is larger than calibration error, in both two-stage and conventional. In this example, the validation/calibration gap is slightly larger with two stages, but the stage 2 validation error is well below the stage 1 calibration error. This gap can be reduced thorough statistical regularization.

Utilization of the disclosed two-stages can provide advantages in filtering out known forms of systematic error. For example, in an embodiment of the present invention, one stage of the model can be dedicated to providing added protection against any systematic errors that can feasibly be simulated over the small area of calibration targets. Performing Monte Carlo simulations during stage 2 can protect against systematic errors that have a stochastic driving component, such as process fluctuations when printing calibration data. Thus, a dedicated stage 1 compact model can approximately capture entirely deterministic improvements to OPC-compatible CTR. For example, model predictions from slower resist process simulators (e.g., S-Litho) might be used as the calibration data for stage 1 of the disclosed method. A minimal goal would merely be for stage 1 to improve on CTR, since this would suffice to give stage two a better "image" input. CM1 and VT5 basis terms have heuristic similarity to key resist physical effects, so aspects of embodiments of the present invention advantageously provide two stages of filtering against systematic errors that have "non-resist-like" signatures.

Figure 8:
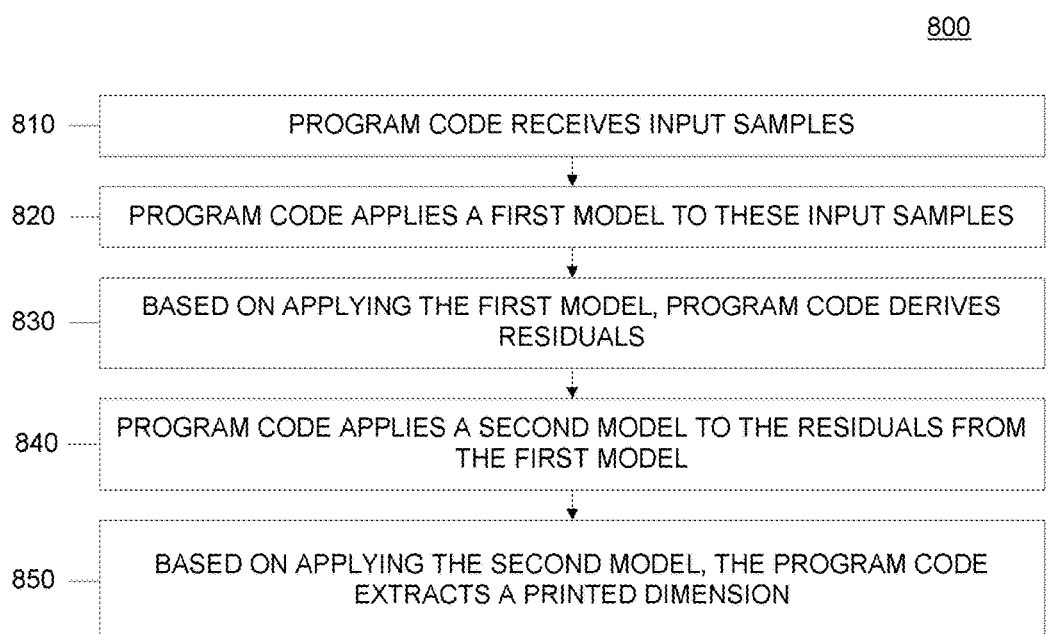
FIG. 8 is a workflow depicting aspects of an embodiment of the present invention.

FIG. 8 is a workflow 800 that depicts aspects of an embodiment of the present invention. As depicted in this workflow, embodiments of the present invention utilize both a compact model similar to a CM1 followed by a compact model similar to a VT5 model. FIG. 8 depicts the program code applying the two models generally. As depicted in FIG. 8, the program code receives input samples (810) and the program code applies a first model to these inputs (820). In an embodiment of the present invention, the first model is a compact resist model. Based on applying the first model, the program code derives residuals (830). The program code applies a second model to the residuals from the first model (840). In an embodiment of the present invention, the second model is a ridge regression model. Based on applying the second model, the program code extracts a printed dimension (850). In some embodiments of the present invention, the second stage model is utilized as a ridge regression model, which is similar to a VT5 model, but a VT5 model has different model forms. Some model forms use the density of curvature terms and some model forms do not use density of curvature terms.

Figure 9:
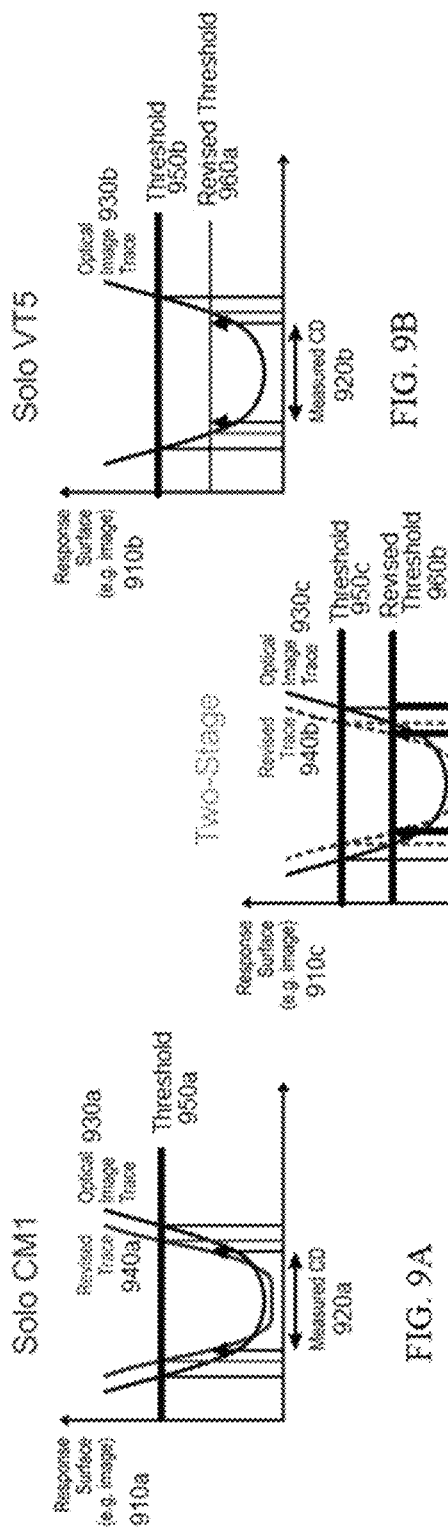
FIGS. 9A-9C illustrate various aspects of certain embodiments of the present invention.

In an embodiment of the present invention, the first model is a compact resist model and the second model is a ridge regression model. By utilizing these types of models, the program code approximates the residuals of first stage using ridge regression and uses the corrected threshold for print image extraction. The two models are understood to provide complementary coverage FIGS. 9A-9C also provide an illustrative example of utilizing an embodiment of the present invention, which includes the application by one or more programs of two models (as described, e.g., in FIG. 3) as opposed to the individual application of each model. Because embodiments of the present invention include one or more programs applying an established modelform at each of at least two stages, FIGS. 9A-9C contrast results of applying a CM1 (e.g., compact resist model) model and a VT5-like model (e.g., a ridge regression model), individually, with applying both stages, in accordance with an embodiment of the present invention. FIG. 9A illustrates a solo application of a CM1 model, FIG. 9B shows a solo application of a VT5 model, and FIG. 9C provides an illustration of the disclosed two-stage process on an embodiment of the present invention. As seen in FIG. 9C, which shows a result of applying the two-stage method on an embodiment of the present invention, the two modelforms provide complementary coverage. As described above, in an embodiment of the present invention, one or more programs executing on a processing circuit apply the VT5 in its standard role, i.e., as a way to match/predict CD data, by robustly adjusting the print threshold for an image in a pattern-specific way, except that with staging, the "image" in question is actually a CM1 modelform response surface, that has already locked in a significant degree of correction for resist effects, such that the "resist" behavior, in the second figurative patterning step, is made more ideal. As illustrated in FIG. 9A, when one or more programs applied a CM1 model by itself, the one or more programs determine a revised trace 940a and a measured CD 920a, based on the revised trace 940a. The one or more programs applying the model utilize the image 910a, the response surface, an optical image trace 930a, and a threshold 950a. Meanwhile, as illustrated in FIG. 9B, the one or more programs apply a VT5-like model, which provides a revised threshold 960a for a measured CD 920b. Also displayed in FIG. 9B, and utilized by the one or more programs, are a threshold 950b, an optical image trace 930b, and the image 910b. Finally, FIG. 9C, which illustrates a result of one or more programs applying the two-stage method described herein, the one or more program adjusts the measured CD 920c, in accordance with a revised threshold 960b, as well as a revised trace 940b.

Figure 10:
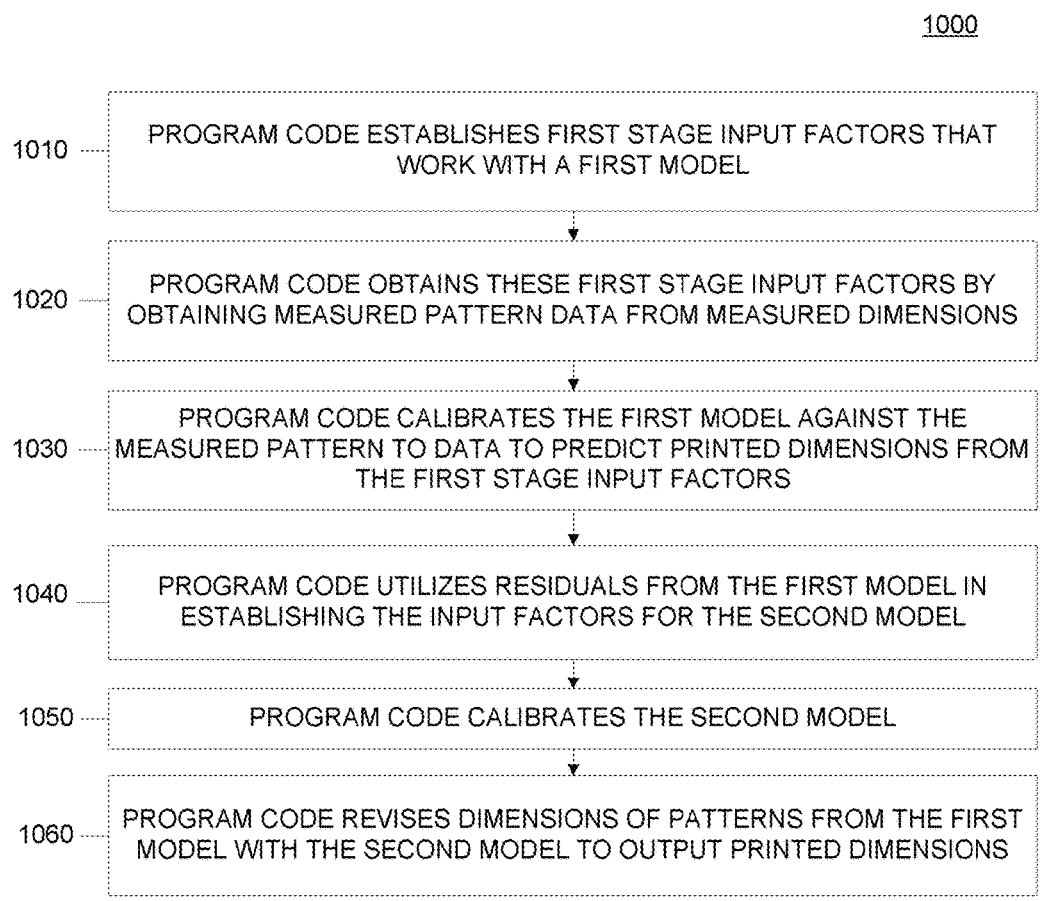
FIG. 10 is a workflow depicting aspects of an embodiment of the present invention.

FIG. 10 illustrates, with an additional workflow 1000, aspects of FIG. 9C, including the method applied by program code in FIG. 9C, for rapidly predicting the dimensions of patterns printed by a lithographic process. In an embodiment of the present invention, the program code establishes first stage input factors that work with a first model (1010). The program code then obtains these first stage input factors by obtaining measured pattern data from measured dimensions (1020). Thus, these measured dimensions are known at this stage in the process. The program code calibrates the first model against the measured pattern to data to predict printed dimensions from the first stage input factors (1030). The results of the application of this first model can be referred to as residuals. In an embodiment of the present invention, the program code may apply statistical tests and constraints to avoid overfitting to the model as part of the calibration.

Returning to FIG. 10, the program code establishes second stage input factors for a second model (1040). The program code utilizes the residuals from the first model in establishing the input factors for the second model. In an embodiment of the present invention, the program code establishes the second stage input factors (i.e., input factors for a second stage prediction) by deriving them from the mask patterns, image intensity patterns, and the computations of the first stage model. The program code then calibrates the second model (1050). In an embodiment of the present invention the program code calibrates the second model against the measured pattern data to predict deviations of the printed dimensions from the first stage predictions by utilizing the second stage input factors and applying statistical tests and constraints to suppress overfitting. The program code revises dimensions of patterns from the first model with the second model to output printed dimensions (1060). Thus, the program code predicts the dimensions of lithographic patterns by using the second model to revise the predictions of the first model.

Some embodiments of the present invention employ specialized model forms in embodiments where a first stage vertical model is used to correct the systematic approximations that are generally adopted during lithographic image calculations in order to make full-chip mask design computationally affordable. Approximations of this kind may include truncation of the coherent decomposition series (e.g., a Mercer series) that is used to represent the partially coherent imaging kernel, and reduction of the so-called optical diameter (or ambit) to a size that is significantly smaller than a simulation frame.

In some embodiments that use a first stage compact model to correct such approximations, the calibration data may be obtained by simulation; for example, accurate simulation that takes advantage of the fact that the area of a typical set of calibration targets is small enough to allow their optical images to be calculated without making the standard approximations that ordinarily trade-off accuracy for speed to enable operation at full-chip scale. One set of embodiments in this category use a first-stage calibrated model of the variable dose type, i.e., a first-stage model that predicts the thresholded dimensions which would be found in an accurately calculated image by using a modelform, to generate a variation in the exposing dose that is added to the accumulated energy input to the resist according to an approximately calculated image, i.e., added to an image that is calculated with the usual approximations that are adopted during full-chip operation. During OPC operation, a second stage compact model may determine a varying adjustment in the threshold for each printed pattern being analyzed, where this second stage model may take the form of a well-established variable threshold model, such as a VT5 model, and might be calibrated using measurements of exposed calibration patterns.

Specialized first stage models that can be utilized in these embodiments include two kinds of kernels to determine the varying dose adjustment. A first kind of kernel filters the mask spatial frequencies, and a second kind of kernel filters the squared outputs of the first kernels. Based on standard Fourier relationships that govern optical imaging, the first set of kernels can be considered to be spatial-domain convolution kernels that operate in the mask plane, while kernels in the second set can be regarded as spatial-domain convolution kernels that operate in the image plane. Specifically, kernels in the second set use as input a pattern formed as the square of the summed two dimensional (2D) inverse Fourier transforms of the mask frequencies as filtered in the frequency domain by the first set of filters. The output pattern from the convolutions with the kernels of the second kind is then added as an adjustment to the approximately calculated image of the mask.

In certain embodiments of the present invention, the filters of the first kind (which can be a plurality of these filters utilized together) can be initialized to pass mask frequencies that are diffracted near the edge of the lens pupil by regions of the illuminating source pattern which have strong gradients. A separate filter may be employed for each such contiguous set of frequencies that is diffracted in this way by a significant portion of the source. In some embodiments of the present invention, the filters of the second kind (which can be one to many filters) are centered spatially on the output point of the convolution, and are be initialized to have a falloff width in the spatial domain that is modestly smaller than the optical ambit. In some embodiments of the present invention, at least some (and sometimes, all) filters are given a Gaussian shape, with peak heights and widths that are adjusted from their initialized values to maximize fit accuracy by using standard regression methods. The center frequencies of the filters of the first kind may also be adjusted as part of the calibration process.

Some embodiments of the present invention employ differing modes of horizontal layering. In an embodiment of the present invention, one or more programs executed by at least one processing circuit add additional calibrated terms to a final vertical model in order to refine the final blended prediction to a higher level of accuracy than is typically achieved by the preceding horizontal models. The one or more programs group and classify the patterns based on human-defined categories, such as similarity to critical patterns (e.g., SRAM cells in different proximity contexts), or 1D vs 2D character. To avoid breakdowns in robustness, the one or moe programs include a conventional general-purpose model as one of the horizontal layers in the procedure, and have the vertical classifier/blending algorithm give dominant weight to this general model whenever a new pattern that is being processed does not clearly belong to any particular one of the specialized pattern/model categories.

Returning to embodiments of the present invention that utilize a vertical layering approach, in certain embodiments of the present invention, one or more programs can perform Monte Carlo simulations to guide adjustments in the selection of calibration patterns and the choice of modelform (as well as being used to adjust regularization strength). By running the Monte Carlo simulations, the one or more programs test the sensitivity to anomalies including but not limited to random errors in measurement, and/or imperfect process stability. In one aspect, the one or more programs can utilize Monte Carlo simulations to identify model terms and calibration patterns which are excessively sensitive to residual process fluctuations that will perturb the calibration data, such as errors in the mask critical dimensions (CDs), exposure dose, or focus set point, that were employed when the calibration CDs were printed. The impact from such errors will be highly correlated between different patterns, unlike random SEM repeatability errors. Thus, in an embodiment of the present invention, a modelform and cal/val split selection can be modified in outer loops that make use of these Monte Carlo simulations, re-running the second stage and optionally, the first stage, if adjustments are made there, after each trial modification. Monte Carlo simulations of stochastic error sources can also be used to improve the sample plan that will be employed in future acquisitions of calibration data. In one non-limiting example, future measurement sets for similar process levels might spread the budgeted number of calibration CDs across a larger number of wafers if Monte Carlo testing per this two-stage method shows that the contribution to model error from known levels of wafer-to-wafer variation is substantial. In an embodiment of the present invention, variability that mimics potential SEM algorithm choices may also be introduced.

In certain embodiments of the present invention, vertical stages (e.g., a first stage) can be dedicated to fitting (in isolation) those errors which are neglected for computational speed during OPC, but which can feasibly be modeled over the small area of calibration targets. As a result, the effective aerial image that a second stage takes as an input, by means of a first stage compact model that is computationally feasible at full chip scale, is more accurate and detailed. In an embodiment of the present invention, one or more programs accurately simulate CDs to serve as the calibration data for the first stage model, while the one or more programs calculate model basis terms using standard fast-but-approximate OPC-compatible algorithms. The staging would allow modeling efforts to be focused on these errors during the first stage.

In an embodiment of the present invention, a first stage pattern count is increased based on the one or more programs simulating if all fitted CDs. The one or more programs may simulate the first stage CDs, which would reduce the number of SEM CDs for the second stage, because the first stage can reduce the magnitude of the correction needed from the second stage. In an embodiment of the present invention the one or more programs utilize model predictions from slower resist process simulators (e.g., S-Litho) as the calibration data for the first stage. Thus, the first stage would improve on CTR, since even a limited improvement in an enhanced aerial image that is input to the second stage (i.e., exceeding a purely optical AI) could be sufficient to improve the overall final accuracy beyond what the second stage modelform could achieve in conventional standalone mode.

In an embodiment of the present invention, the one or more programs utilize a CM1 model as a final vertical stage. The one or more programs calibrate this CM1 model against SEM measurements using a $c_0$ term that would include contributions from a previous vertical model stage. This previous stage would approximately correct known errors using the usual very-fast-but-approximate aerial image intensity as a base. Embodiments of the present invention can also handle sums of coherent systems (SOCS) truncation errors and mask 3D behavior in this manner.

For simplicity, descriptions throughout this paper have discussed dual stage models when describing aspects of embodiments of the present the invention, but use of more than two stages is straightforward and can be utilized to further improve measurements. In general, embodiments of the present invention can utilize different cal/val splits in both the first and the second stage. However, in certain embodiments the set-aside verification set includes many patterns that are not used in either stage's calibration fits. Though the first stage locks in the benefit provided by a proven modelform, the method does not preclude the possibility of adding similar terms for joint adjustment during the second stage, if overfitting can be avoided (e.g., if improved optical accuracy does not immediately improve overall accuracy). In an embodiment of the present invention, during calibration, candidate basis terms in the second stage model can be added or removed from a working modelform by using stepwise search. In these embodiments, a two-stage calibration step is embedded in outer loops that make trial adjustments to the modelform. Certain embodiments of the present invention apply lasso-type algorithms for the search if the fitting metric uses an L1 norm. Certain embodiments of the present invention may utilize regularized least squares metrics and/or singular value decomposition (SVD) and matrix inverse update formulas (Sherman-Morrison-Woodbury) to rapidly identify a particular candidate basis term which provides the largest improvement when added to the model-form, and/or which basis term has the least impact if removed from the model-form. To help prevent overfitting, embodiments of the present invention may utilize a one-by-one cross-validation method in which matrix update methods very rapidly determine the differential error when predicting a verification result after the associated datapoint is removed from the calibration set.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   selecting, by a processor, first stage input factors for utilization with and assigning each step in a litho simulation process to a first computer-implemented model;
   measuring, by the processor, pattern data from existing measured dimensions of a semiconductor to obtain values for the first stage input factors;
   calibrating, by the processor, the first computer-implemented model against the measured pattern data;
   applying, by the processor, the calibrated first computer-implemented model to predict printed dimensions from the values of the first stage input factors, wherein the printed dimensions from applying the calibrated first computer-implemented model comprise residuals;
   selecting, by the processor, based on the residuals, second stage input factors for a second computer-implemented model, wherein the selecting comprises assigning each step in the litho simulation process to the second computer-implemented model;
   calibrating, by the processor, the second computer-implemented model against the measured pattern data to predict deviations of predicted printed dimensions, from the printed dimensions from the values of the first stage input factors, by utilizing values of the second stage input factors; and
   producing, by the processor, the predicted printed dimensions of a lithographic pattern by using the second computer-implemented model to revise the printed dimensions of the first computer-implemented model.

2. The method of claim 1, wherein the first computer-implemented model and the second computer-implemented model are non-physical compact models for optical lithography simulation.

3. The method of claim 2, wherein the first computer-implemented model is a compact resist model and the second computer-implemented model is a ridge regression model.

4. The method of claim 1, wherein calibrating the first computer-implemented model comprises:
   applying, by the processor, statistical tests and constraints to the first computer-implemented model, wherein the applying comprises stopping the applying before overfitting to the first computer-implemented model.

5. The method of claim 1, wherein selecting the second stage input factors further comprises deriving the second stage input factors additionally from mask patterns and image intensity patterns related to the semiconductor.

6. The method of claim 1, wherein calibrating the second computer-implemented model further comprises:
   applying, by the processor, statistical tests and constraints to suppress overfitting.

7. The method of claim 1, the method further comprising:
   fabricating a mask utilizing a lithographic pattern with the predicted printed dimensions; and
   printing the lithographic pattern with the predicted printed dimensions on a computer chip in accordance with the mask.

8. The method of claim 1, the method further comprising:
   generating, by the processor, a mask to utilize when printing a chip, the mask comprising the lithographic pattern with the predicted printed dimensions.

9. The method of claim 1, the method further comprising:
   modeling, by the processor, a mask to print a chip, the mask comprising the lithographic pattern with the predicted printed dimensions;
   obtaining, by the processor, measurements from at least one circuit clip to be utilized with the mask; and
   adjusting, by the processor, the lithographic pattern, the predicted printed dimensions, based on the measurements from the at least one circuit clip.

10. The method of claim 9, further comprising:
    generating, by the processor, the mask to print the chip, the mask comprising the lithographic pattern with the adjusted predicted printed dimensions; and
    printing, by a printer communicatively coupled to the processor, the adjusted revised printed dimensions on a computer chip according to the mask.

11. The method of claim 1, wherein the calibrated first computer-implemented model and the calibrated second computer-implemented model are applied sequentially.

12. The method of claim 1, wherein the calibrated first computer-implemented model and the calibrated second computer-implemented model are applied concurrently.

* * * * *